(12) United States Patent
Ma

(10) Patent No.: US 10,312,895 B2
(45) Date of Patent: *Jun. 4, 2019

(54) APPARATUS AND METHOD FOR INSTANT-ON QUADRA-PHASE SIGNAL GENERATOR

(71) Applicant: Micron Technology, Inc., Boise, ID (US)

(72) Inventor: Yantao Ma, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/028,253

(22) Filed: Jul. 5, 2018

(65) Prior Publication Data

US 2018/0316338 A1 Nov. 1, 2018

Related U.S. Application Data

(63) Continuation of application No. 15/856,244, filed on Dec. 28, 2017, which is a continuation of application
(Continued)

(51) Int. Cl.
*H03K 5/159* (2006.01)
*H03K 5/15* (2006.01)
(Continued)

(52) U.S. Cl.
CPC ........ *H03K 5/15013* (2013.01); *G11C 7/222* (2013.01); *G11C 8/10* (2013.01); *G11C 11/4076* (2013.01); *H03B 27/00* (2013.01);

*H03D 7/165* (2013.01); *G11C 7/20* (2013.01); *G11C 11/4072* (2013.01)

(58) Field of Classification Search
None
See application file for complete search history.

(56) References Cited

U.S. PATENT DOCUMENTS 6,271,738 B1   8/2001   Kimura
7,230,465 B2   6/2007   Kim et al.
(Continued)

FOREIGN PATENT DOCUMENTS

WO   2018038921 A1   3/2018

OTHER PUBLICATIONS

International Search Report and Written Opinion dated Nov. 23, 2017 for PCT Application No. PCT/US2017/046123.
(Continued)

*Primary Examiner* — Cassandra F Cox
(74) *Attorney, Agent, or Firm* — Dorsey & Whitney LLP

(57) ABSTRACT

Apparatuses are provided for a quadra-phase clock signal generator. An example apparatus includes a first delay circuit configured to receive a first input clock signal generating a first delayed clock signal. A first phase mixer is provided communicatively coupled to the first delay circuit and configured to receive the first delayed clock signal at a first input and a second input clock signal at a second input. The first phase mixer may then generate a first output clock signal at a first output node responsive, at least in part, to mixing of the first delayed clock signal and the second input clock signal.

20 Claims, 8 Drawing Sheets

Related U.S. Application Data

No. 15/245,038, filed on Aug. 23, 2016, now Pat. No. 9,912,328.

(51) Int. Cl.

| | | |
|---|---|---|
| *G11C 7/22* | (2006.01) | |
| *G11C 8/10* | (2006.01) | |
| *H03D 7/16* | (2006.01) | |
| *G11C 11/4076* | (2006.01) | |
| *H03B 27/00* | (2006.01) | |
| *G11C 7/20* | (2006.01) | |
| *G11C 11/4072* | (2006.01) | |

(56) References Cited

U.S. PATENT DOCUMENTS

| | | | |
|---|---|---|---|
| 7,907,680 | B2 | 3/2011 | Tsai et al. |
| 8,125,252 | B2 | 2/2012 | Ma |
| 8,901,978 | B2 | 12/2014 | Ma |
| 9,912,328 | B1 * | 3/2018 | Ma .................. H03B 27/00 |
| 2005/0002471 | A1 | 1/2005 | Tramm et al. |
| 2008/0180086 | A1 | 7/2008 | Kwak |
| 2009/0268849 | A1 | 10/2009 | Mu et al. |
| 2011/0158297 | A1 | 6/2011 | Ding et al. |
| 2013/0294605 | A1 | 11/2013 | Hagioka |
| 2014/0010336 | A1 | 1/2014 | Suzuki |
| 2014/0253198 | A1 | 9/2014 | Ma et al. |
| 2016/0344378 | A1 | 11/2016 | Saito |
| 2018/0062629 | A1 | 3/2018 | Ma |
| 2018/0123574 | A1 | 5/2018 | Ma |

OTHER PUBLICATIONS

Kim, et al., A 20-Gb/s 256-Mb DRAM With an Inductorless Quadrature PLL and a Cascaded Pre-emphasis Transmitter, IEEE Journal of Solid-State Circuits, vol. 41, No. 1, Jan. 2006, 8 pages.
International Preliminary Report on Patentability for PCT application no. PCT/US2017/046123 dated Mar. 7, 2019; pp. all.

* cited by examiner

US 10,312,895 B2

APPARATUS AND METHOD FOR INSTANT-ON QUADRA-PHASE SIGNAL GENERATOR

CROSS-REFERENCE TO RELATED APPLICATION(S)

This application is a continuation of U.S. patent application Ser. No. 15/856,244, filed Dec. 28, 2017, which is a continuation of U.S. patent application Ser. No. 15/245,038, filed on Aug. 23, 2016, and issued as U.S. Pat. No. 9,912,328 on Mar. 6, 2018. The afore-mentioned applications and patent are incorporated herein by reference, in their entirety, and for any purpose.

BACKGROUND

Periodic signals are used in a variety of applications and devices. Clock signals are a type of periodic signal used to establish signal timings for various operations and commands. For example, in some memory devices, such as synchronous dynamic random access memory (SDRAM), data signals may be read and written synchronized relative to various clock signals. For example, read data is typically retrieved from the memory device based on a read data strobe signal. Write data may be latched in a memory device based on a write data strobe signal. The signals for read, write, and other operations, and their relationship between each other, are typically synchronized to, and based on, internal and/or external clock signals.

For example, one type of conventional quadra-phase design utilizes a phase locked loop (PLL) with multiple adjustable delay lines or analog cells. These conventional designs, however, require long initialization times, spanning multiple clock cycles, and require high power consumption. Moreover, many conventional designs employ a clock divider. When using a divided clock, if the phase of each multi-phase output signal has a 90-degree offset in phase from the previous phase (for example, 0-degrees, 90-degrees, 180-degrees, and 270-degrees), each multi-phase output clock signal has half of the input clock frequency, and each multi-phase output clock signal has a period that is twice that of the original input clock period.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
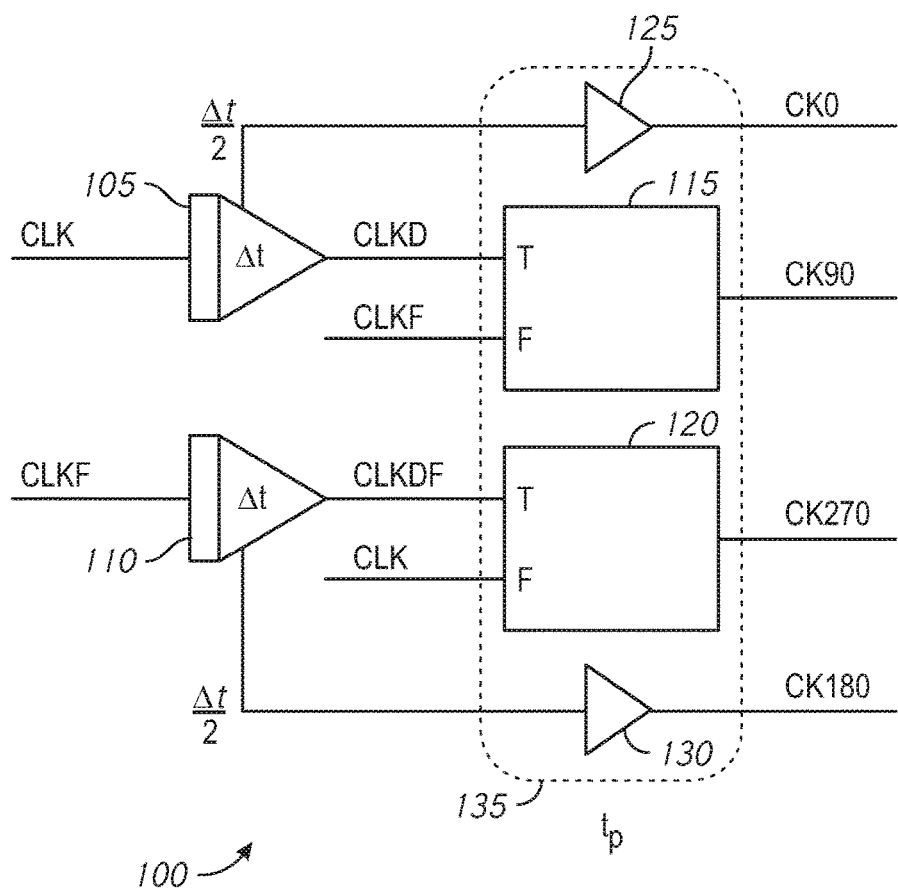
FIG. 1 is a schematic block diagram of a quadra-phase generator, in accordance with various embodiments.

FIG. 1 illustrates a schematic block diagram of a quadra-phase generator 100, according to various embodiments. The quadra-phase generator 100 may receive an input clock signal (CLK), and a complementary input clock signal (CLKF). For example, in some embodiments, the CLKF signal may be inverse in relation to the CLK signal. The CLK signal may be input to a first delay circuit 105, and the CLKF signal may be input a second delay circuit 110. The first delay circuit 105 may output a delayed clock signal (CLKD), and the second delay circuit 110 may output a delayed complementary clock signal (CLKDF). In some embodiments, the CLKDF signal may be inverse in relation to the CLKD signal. In various embodiments, the first and second delay circuits 105, 110 may be delay circuits, such as, without limitation, analog or digital delay lines, a series of one or more delay elements, circular buffers, inverters, buffers, or other suitable delay circuits and components. The first and second delay circuits 105, 110 may each be configured to introduce a delay of Δt to the input signal. Generally speaking, the exact value of the delay, Δt, is not critical to the operation. However, when Δt is chosen such that the rising edge of the CLKD signal gets closer in phase with the rising edge of the CLKF signal, and correspondingly, as the falling edge of the CLKDF signal gets closer in phase with the falling edge of the CLK signal, accuracy and performance of the quadra-phase generator 100 may increase. Thus, in some embodiments, Δt may be selected to be larger than ¼ of the period of the CLK signal, but less than one full period of the CLK signal. In some further embodiments, Δt may be a static value of the first and second delay circuits 105, 110. In such arrangements, Δt may be selected to fall within the range of ¼ of the period of CLK and less than one full period of CLK for the desired range of CLK frequencies. In other embodiments, Δt may be adjustable, as will be discussed in further detail below with respect to FIGS. 6 & 7.

The first and second delay circuits 105, 110 may further include a tap from which a partially delayed signal may be read. In some embodiments, the first and second delay circuits 105, 110 may each include a respective tap outputting a signal with a delay of Δt/2. For example, the first delay circuit 105 may output the CLKD signal, produced by delaying the CLK signal by a delay of Δt, and output, at the tap, a half-delay clock signal produced by delaying the CLK signal by a half delay Δt/2. Similarly, the second delay circuit 110 may similarly output the CLKDF signal by delaying the CLKF signal by a delay of Δt, and output, at the tap, a half-delay complementary clock signal produced by delaying the CLKF signal by a half delay Δt/2. In some embodiments, the first and second delay circuits 105, 110 may have the same delay, Δt/2. In a further set of embodiments, each of the first and second delay circuits 105, 110 may respectively include a delay line having four individual delay elements; each individual delay element may introduce a delay of Δt/4. In this example configuration, the tap may be placed after 2 individual delay elements, thus tapping a half delay clock or complementary clock signal, respectively. Accordingly, the outputs of the first and second delay circuits 105, 110, including the tap outputs of the half-delay signals, may be provided to output block 135.

The output block 135 may include a first phase mixer 115, a second phase mixer 120, a first buffer 125, and a second buffer 130. The output of the first delay circuit 105, CLKD, may be provided as a first input to a first phase mixer 115. The CLKF signal may be provided to the second input of the first phase mixer 115. The first phase mixer 115 may be configured to combine the first and second inputs to generate an output clock signal. For example, in some embodiments, combining may include, without limitation, additive mixing, where the voltage level of the output clock signal is the sum of the voltages of the signals at the first and second inputs. In other embodiments, combining may include, without limitation, multiplicative mixing, or any other suitable mixing technique. As depicted, in some embodiments, the CLKD signal may be received at the first input, and the CLKF signal may be received at the second input, and combined to generate a 90-degree phase output clock signal, CK90. In various embodiments, the first phase mixer 115 may equally weight the first and the second inputs in producing an output. In other embodiment, a different weighting may be applied to the first and second inputs.

Similarly, the output of the second delay circuit 110, CLKDF, may be provided as a first input to a second phase mixer 120. The CLK signal may be provided to the second input of the second phase mixer 12. Like the first phase mixer 115, the second phase mixer 120 may be configured to combine the first and second inputs to generate an output clock signal. As depicted, in some embodiments, the CLKDF signal may be received at the first input, and the CLK signal may be received at the second input, and combined to generate a 270-degree phase output clock signal, CK270. In various embodiments, the second phase mixer 120 may equally weight the first and the second inputs in producing an output. In other embodiment, a different weighting may be applied to the first and second inputs. Accordingly, the first and second phase mixers 115, 120 may include, without limitation, additive mixers, frequency mixers, phase detectors, or any combination of other suitable components.

The half-delay clock signal, tapped from the first delay circuit 105, may be provided as an input to the first buffer 125. Similarly, the half-delay complementary clock signal, tapped from the second delay circuit 110, may be provided as an input to the second buffer 130. In various embodiments, the first phase mixer 115, and the second phase mixer 120 may each exhibit a propagation delay, $t_p$. Accordingly, first buffer 125 and the second buffer 130 may be configured to provide a propagation delay that matches the propagation delay, $t_p$, of the first and second phase mixers 115, 120. In other embodiments, less or additional buffers may be utilized to match the delay on each of the output clock signals. Thus, in the depicted embodiments, the half-delay clock signal, as delayed by the first buffer 125, may be output as a 0-degree phase output clock signal, CK0. Similarly, the half-delay complementary clock signal, as delayed by the second buffer 130, may be output as a 180-degree phase output clock signal, CK180. Accordingly, 0-degree phase, 90-degree phase, 180-degree phase, and 270-degree phase may refer to the quadrature phase relationship between the output clock signals CK0, CK90, CK180, and CK270, respectively.

Thus, the quadra-phase generator 100 provides an architecture for generating quadrature clock signals (separated in phase by a ¼ period or 90-degrees), having full frequency of the input clock signal CLK, over a wide operational bandwidth, and with minimal initialization time, no greater than 1 or 2 clock cycles of the input clock signal CLK. Operation of the quadra-phase generator 100 will be described in more detail below, with respect to FIGS. 3-5.

Figures 2A, 2B:
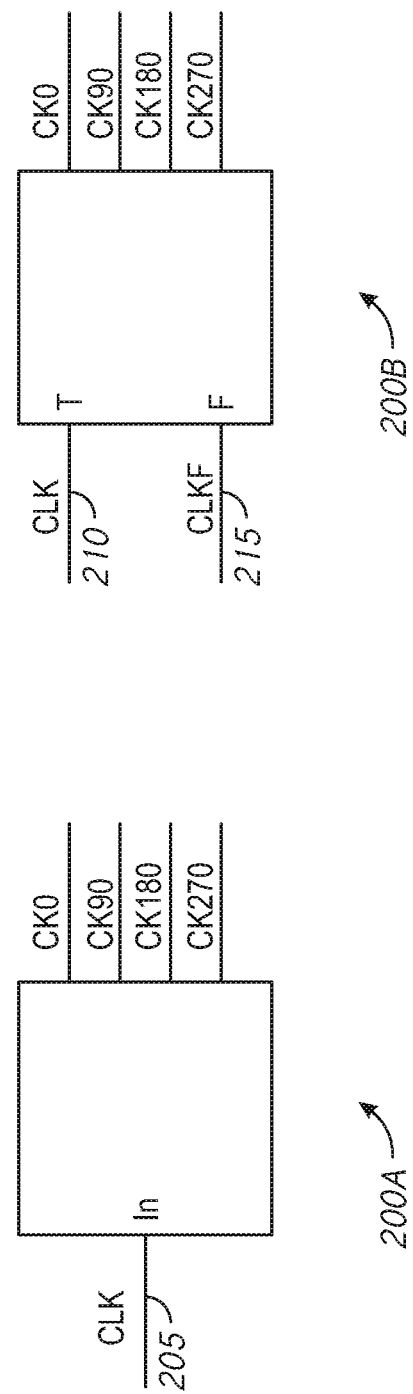
FIG. 2A is a schematic diagram of a one input quadra-phase generator, in accordance with various embodiments.
FIG. 2B is a schematic diagram of a two input quadra-phase generator, in accordance with various embodiments.

FIGS. 2A & 2B are high-level block diagrams of two different embodiments of a quadra-phase generator 200A, 200B. In some embodiments, the quadra-phase generator 200A, shown in FIG. 2A, may have a single input, 205, for receiving input clock signal, CLK. Quadra-phase generator 200A may then, based on the CLK signal, produce a complementary input clock signal, CLKF, internally. For example, in some embodiments, quadra-phase generator 200A may further include a phase splitter circuit configured to generate the CLKF signal from the CLK signal. Quadra-phase generator 200A may otherwise include similar elements, and likewise arranged similarly, to quadra-phase generator 100 described above with respect to FIG. 1.

In an alternative set of embodiments, quadra-phase generator 200B, shown in FIG. 2B, may include a first input 210, and a second input 215. Thus, in embodiments where both an input clock signal CLK and complementary input clock signal CLKF are available, quadra-phase generator 200B may be used. For example, in some embodiments, the first input 210 may be configured to receive CLK, and the second input 215 may be configured to receive CLKF.

Quadra-phase generator 200B may include similar elements arranged similarly to quadra-phase generator 100 described above in FIG. 1.

Figure 3:
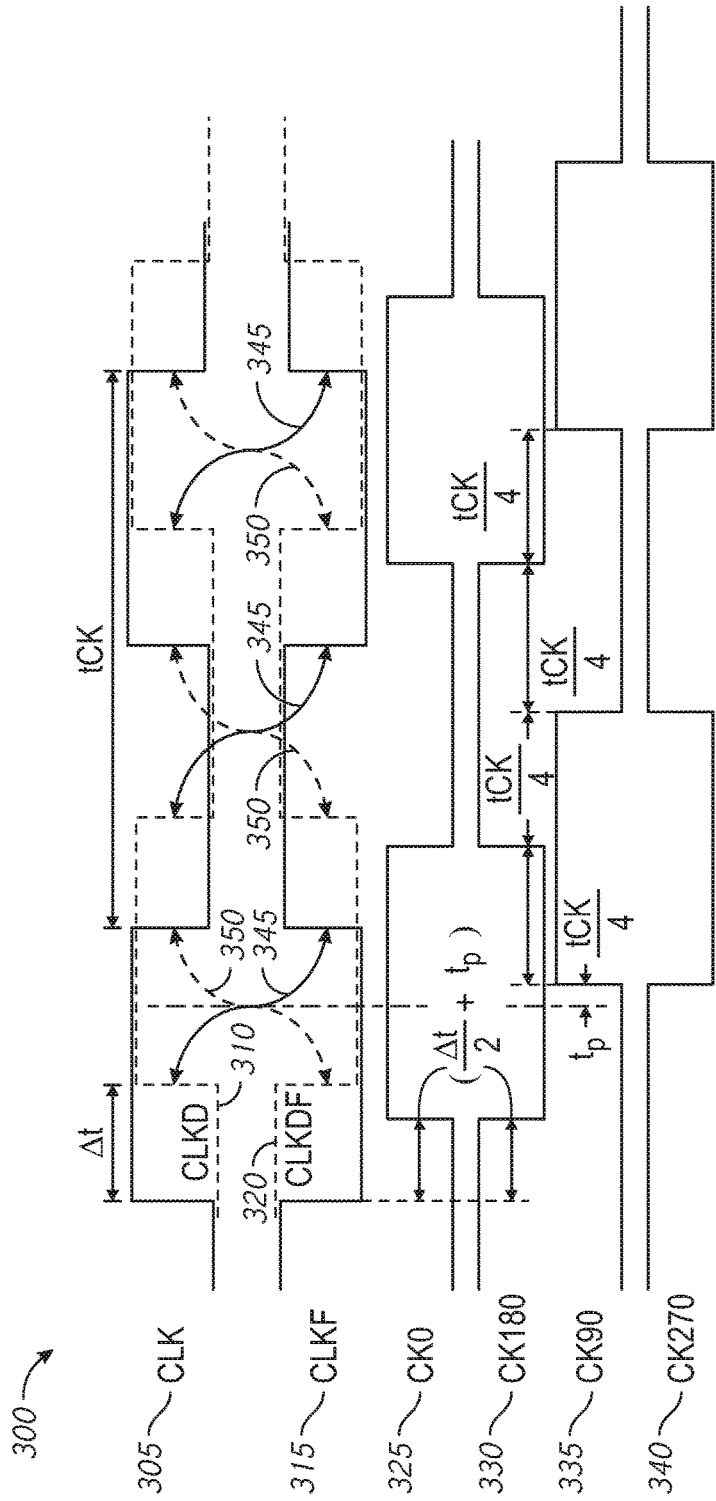
FIG. 3 is a timing diagram for various signals of a quadra-phase generator, in accordance with various embodiments.

FIG. 3 illustrates a timing diagram 300 schematically representing the various waveforms used and output by the quadra-phase generator 100 (FIG. 1), according to various embodiments. The timing diagram 300 includes input clock signal CLK 305, delayed clock signal CLKD 310, complementary input clock signal CLKF 315, delayed complementary clock signal CLKDF 320, 0-degree phase output clock signal CK0 325, 180-degree phase output clock signal CK180 330, 90-degree phase output clock signal CK90 335, and 270-degree phase output clock signal CK270 340. As described above, with respect to FIG. 1, CLK 305 and CLKD 310 are offset by $\Delta t$. CLKD 310 is depicted in dashed lines. As described previously, in some embodiments, CLKD 310 may be CLK 305 delayed by the first delay circuit 105. Similarly, CLKF 315 and CLKDF 320 are also offset by $\Delta t$. CLKDF 320 is depicted in dashed lines. With reference to FIG. 1, in some embodiments, CLKDF 320 may be CLKF 315 as delayed by second delay circuit 110.

Continuing with the example of FIG. 1, in various embodiments, CK0 325 is produced from a half-delay input clock signal, taken from a tap of the first delay circuit 105 at the point where CLK 305 is delayed by $\Delta t/2$, which is half of the delay, $\Delta t$. The output from the tap is passed through a buffer to match the propagation delay, $t_p$, introduced by the respective phase mixer. Accordingly, as depicted, the first rising edge of CK0 325 is delayed by $\Delta t/2 + t_p$ from the first rising edge of CLK 305.

Similarly, in various embodiments, CK180 330 is produced from a half-delay complementary input clock signal, taken from a tap of the second delay circuit 110 at the point where CLKF 315 is delayed by $\Delta t/2$, which is half of the delay, $\Delta t$. The output from the tap is passed through a buffer to match the propagation delay, $t_p$, introduced by the respective phase mixer. Accordingly, as depicted, the first falling edge of CK180 330 is delayed by $\Delta t/2 + t_p$ from the first falling edge of CLKF 315.

CK90 335 may be output by a first phase mixer, combining inputs CLKD 310 and CLKF 315. In various embodiments, CLK 305 may have a period of tCK, as depicted. Accordingly, the first rising edge of CLKD 310 and the first rising edge of CLKF 315 may be offset by half of the period of the clock signal, tCK/2, minus the delay of CLKD 310, $\Delta t$. Thus, the offset between the rising edges of CLKD 310 and CLKF 315 may be tCK/2−$\Delta t$. In the depicted embodiments, when combined by a phase mixer, as depicted by the arrow 345 from the rising edge of CLKD 310 to the rising edge of CLKF 315, the midpoint between the rising edges of CLKD 310 and CLKF 315 corresponds to the rising edge of CK90 335, plus the propagation delay $t_p$ for the mixing process. In this example, the rising edge of CK90 335 may correspond to the midpoint between the rising edges of CLKD 310 and CLKF 315 based, at least in part, on the equal weighting of both CLKD 310 and CLKF 315 by the phase mixer. The midpoint between the rising edges of CLKD 310 and CLKF 315 occurs at tCK/4−$\Delta t/2$ before the rising edge of CLKF 315, or after the rising edge of CLKD 310. In turn, the rising edge of CK90 335 is delayed by $t_p$ after the midpoint between the rising edges of CLKD 310 and CLKF 315. Given this relationship, the rising edge of CK90 335 is a quarter cycle, tCK/4, later than the rising edge of CK0 325.

Similarly, CK270 340 may be output by a second phase mixer, combining inputs CLK 305 and CLKDF 320. Accordingly, the falling edges of CLKDF 320 and CLK 305 may be offset by half of the period of the clock signal, tCK/2 minus the delay between CLKDF 320 and CLKF 315, $\Delta t$. Thus, the offset between the falling edges CLK 305 and CLKDF 320 may be tCK/2−$\Delta t$. When combined by the second phase mixer, as depicted by the arrow 350 from the falling edge of CLKDF 320 to the falling edge of CLK 305, the midpoint between the falling edges of CLKDF 320 and CLK 305 corresponds to the falling edge of CK270 340 plus the propagation delay $t_p$ for the phase mixer. In this example, the falling edge of CK270 340 may correspond to the midpoint between the falling edges of CLKDF 320 and CLK 305 due, at least in part, to the equal weighting of the inputs. Accordingly, as shown with respect to CK270 340, the falling edge is a quarter cycle, tCK/4, later than the falling edge of CK180 330.

It is to be understood that the waveforms CLK 305, CLKD 310, CLKF 315, CLKDF 320, CK0 325, CK90 330, CK180 335, and CK270 340 are depicted as square waves for the purpose of simplifying conceptual understanding of the relationship between the various waveforms. It will be understood in actual operation, the each of the above mentioned waveforms may have a more gradual transition between low and high states.

Figure 4:
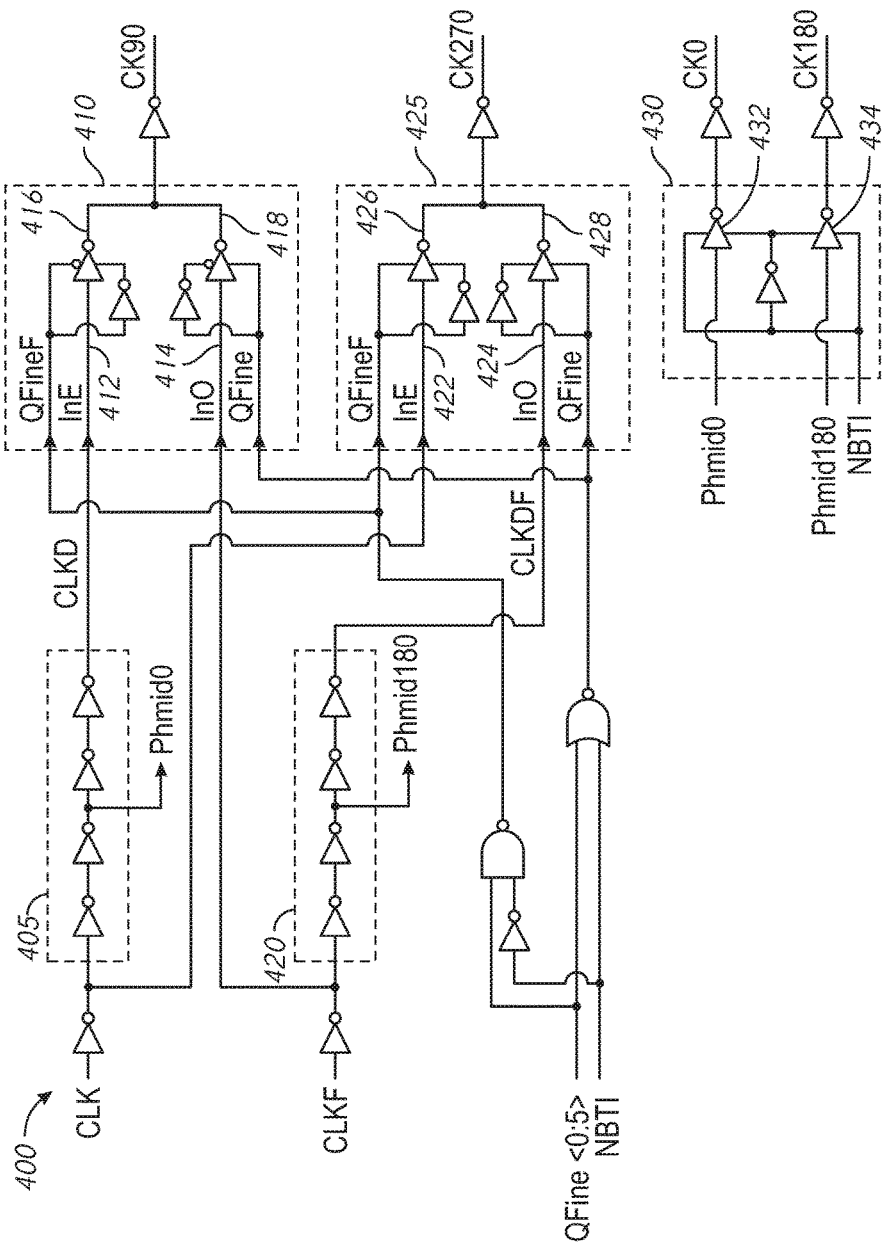
FIG. 4 is a circuit diagram of an implementation of the quadra-phase generator, in accordance with various embodiments.

FIG. 4 illustrates a circuit implementation of the quadra-phase generator 400, according to various embodiments. The quadra-phase generator 400 may include an input clock signal, CLK, a complementary input clock signal, CLKF, a first delay circuit 405, a second delay circuit 420, a first phase mixer 410, second phase mixer 425, and a delay matching block 430.

The first delay circuit 405 may include a tap outputting a half-delay input clock signal, Phmid0. Similarly, the second delay circuit 420 may also include a tap outputting a half-delay complementary input clock signal, Phmid180. The half-delay clock signals Phmid0 and Phmid180 may in turn be provided as inputs to the delay matching block 430. In some embodiments, with relation to FIG. 1, the delay matching block 430 may include first and second buffers 125, 130. Also in contrast with FIG. 1, in some embodiments, an inverter may be provided before the first and second delay circuits 405, 420. Correspondingly, inverters may also be provided at the outputs of the first phase mixer 410, second phase mixer 425, and delay matching block 430. In other embodiments, these inverters may be excluded—as depicted in FIG. 1.

The first phase mixer 410 may further include a first input, InE, having a first input line 412 coupled to the input of a first controlled inverter, and a second input, InO, having a second input line 414 coupled to the input of a second controlled inverter. The first phase mixer 410 may further include a control signal input, QFine, configured to provide a control signal to the first controlled inverter, and a complementary control signal input, QFineF, configured to provide a complementary control signal to the second controlled inverter. The output of the first controlled inverter may be coupled, via a first output line 416, to a common output node. The output of the second controlled inverter may be coupled via a second output line 418, to the common output node. Thus, CLKD and CLKF may be driven, by the controlled inverters of the first phase mixer 410, to the common output node, to produce the output clock signal CK90. In this way, CK90 may be a combination of CLKD and CLKF as combined, or mixed, by the first phase mixer 410.

Similarly, the second phase mixer 425 may include a first input, InE, having a first input line 422 coupled to the input of a first controlled inverter, and a second input, InO, having a second input line 424 coupled to the input of a second controlled inverter. The second phase mixer 425 may further include a control signal input, QFine, configured to provide a control signal to the first controlled inverter, and a complementary control signal input, QFineF, configured to provide a complementary control signal to the second controlled inverter. The output of the first controlled inverter may be coupled, via a first output line 426, to a common output node. The output of the second controlled inverter may be coupled via a second output line 428, to the common output node. Thus, CLKDF and CLK may be driven, by the controlled inverters of the second phase mixer 425, to the common output node, to produce the output clock signal CK270. In this way, CK270 may be generated by mixing CLKDF and CLK at the common output node of the second phase mixer 425.

The delay matching block 430 may include a first controlled inverter 432, receiving at its input a half-delay input clock signal, Phmid0, and a second controlled inverter 434, receiving at its input a half-delay complementary input clock signal, Phmid180. In various embodiments, the first controlled inverter 432 may generate the CK0 signal based on the Phmid0 signal, and the second controlled inverter 434 may generate the CK180 signal based on the Phmid180 signal. The first and second controlled inverters 432, 434 may be controlled by control signal NBTI. In some embodiments, the NBTI signal may be an enable signal. In some further embodiments, the NBTI signal may be a control signal for mitigating negative bias temperature instability. For example, in some instances, the NBTI signal may be used to activate or deactivate the first and second controller inverters 432, 434 of the delay matching block 430, and the first and second phase mixers 410, 425, to make uniform threshold voltage degradation experienced by the various elements.

According to various embodiments, the input clock signal may be provided to a first delay circuit 405, and a complementary input clock signal may be provided to a second delay circuit 420. The first delay circuit 405 may include one or more inverters, each inverter delaying the input clock signal by a propagation delay. In one set of embodiments, as depicted, the first delay circuit 405 may include four inverters, each having a propagation delay of $\Delta t/4$. In other embodiments, the first delay circuit 405 may be an adjustable delay circuit, which may allow adjustment of the delay, $\Delta t$, based on a frequency of the input clock signal CLK. For example, $\Delta t$ may be adjusted, based on the period of CLK, to be in the range of ¼ of the period of CLK to one full period of CLK. In various embodiments, the first and second delay circuits 405, 410 may be delay circuits, such as, without limitation, analog or digital delay lines, a series of one or more delay elements, circular buffers, inverters, buffers, or other suitable delay circuits and components. The first and second delay circuits 405, 420 may thus be configured to introduce a delay of $\Delta t$ to the input signal. A half-delay clock signal output may be provided via a tap in each of the first and second delay circuits 405, 420. The tap from the first delay circuit 405 may provide a half-delay input clock signal Phmid0, while the from the second delay circuit 420 may provide a half-delay complementary input clock signal, Phmid180.

As described above, the first delay circuit 405 may further provide a delayed clock signal, CLKD, to a first input, InE, of the first phase mixer 410. The first phase mixer 410 may also receive, at a second input, InO, the complementary input clock signal, CLKF, that has not been delayed. In various embodiments, the input paths, first input line 412 and second input line 414, and output lines, first output line 416 and second output line 418, may be matched for path length and delay of the InE and InO clock paths. Accordingly, the first phase mixer 410 may be configured to have a propagation delay of $t_p$.

This configuration may be mirrored in the second phase mixer 425. For example, the second phase mixer 425 may receive the input clock signal. CLK at its first input, InE. The second input, InO, may receive the delayed complementary input clock signal, CLKDF. In various embodiments, the input paths for each of the clock signals, first input line 422, second input line 424, and the output lines, first output line 426 and second output line 428, may be matched such that the second phase mixer 425 also has a propagation delay of $t_p$.

Similarly, the half-delay clock signals from the taps of the first and second delay circuits 405, 420 may be provided to the delay matching block 430. The first controlled inverter 432 and second controlled inverter 434 may, in turn, be configured to have a propagation delay, $t_p$, matched to the propagation delay of the first and second phase mixers 410, 425.

The control signal, QFine, may be configured to adjust the drive strength of the controlled inverters of the first and second phase mixers 410, 425. As previously described, the control signal, NBTI, may be configured as an enable signal. For example, when NBTI is low, QFine may be disabled, deactivating the controlled inverters of the first and second phase mixers 410, 425. Similarly, NBTI may also deactivate the controlled inverters 432, 434 of the delay matching block 430. In various embodiments, QFine may be configured to adjust the drive strength of the controlled inverters of the first and second phase mixers 410, 425. In some embodiments, QFine may be used to adjust for the phase differences of the clock signals on the respective InO and InE of the first and second phase mixers 410, 425. For example, QFine may be used to adjust for phase differences between CLKD and CLKF for the first phase mixer 410, and CLK and CLKDF for the second phase mixer 425. Generally speaking, when the input signals on InO and InE are closer together in phase, the first and second phase mixers 410, 425 provide more accurate output signals in relationship to outputs CK0 and CK180. In various embodiments, accuracy may refer to the mitigation of phase error between the signals. When a larger phase difference is present, by adjusting the operation of the first phase mixer 410, for example, by correspondingly adjusting the drive strength of the controlled inverters, the phase error between the output clock signals, CK90, CK270 may be reduced. In one set of embodiments, the drive strength of the controlled inverters of the first and second phase mixers 410, 425 may be increased to account for larger phase differences, and decreased for smaller phase differences. In other embodiments, this relationship may be reversed. Accordingly, one skilled in the art will appreciate that, although the depicted embodiments provide a QFine signal having 6 bits, in other embodiments, QFine may have more or less bits. Additional bits may allow for the mixing of signals with larger phase differences. Generally, the number of bits assigned to QFine corresponds to the granularity with which the drive strengths of the first and second phase mixers 410, 425 may be controlled.

Figure 5:
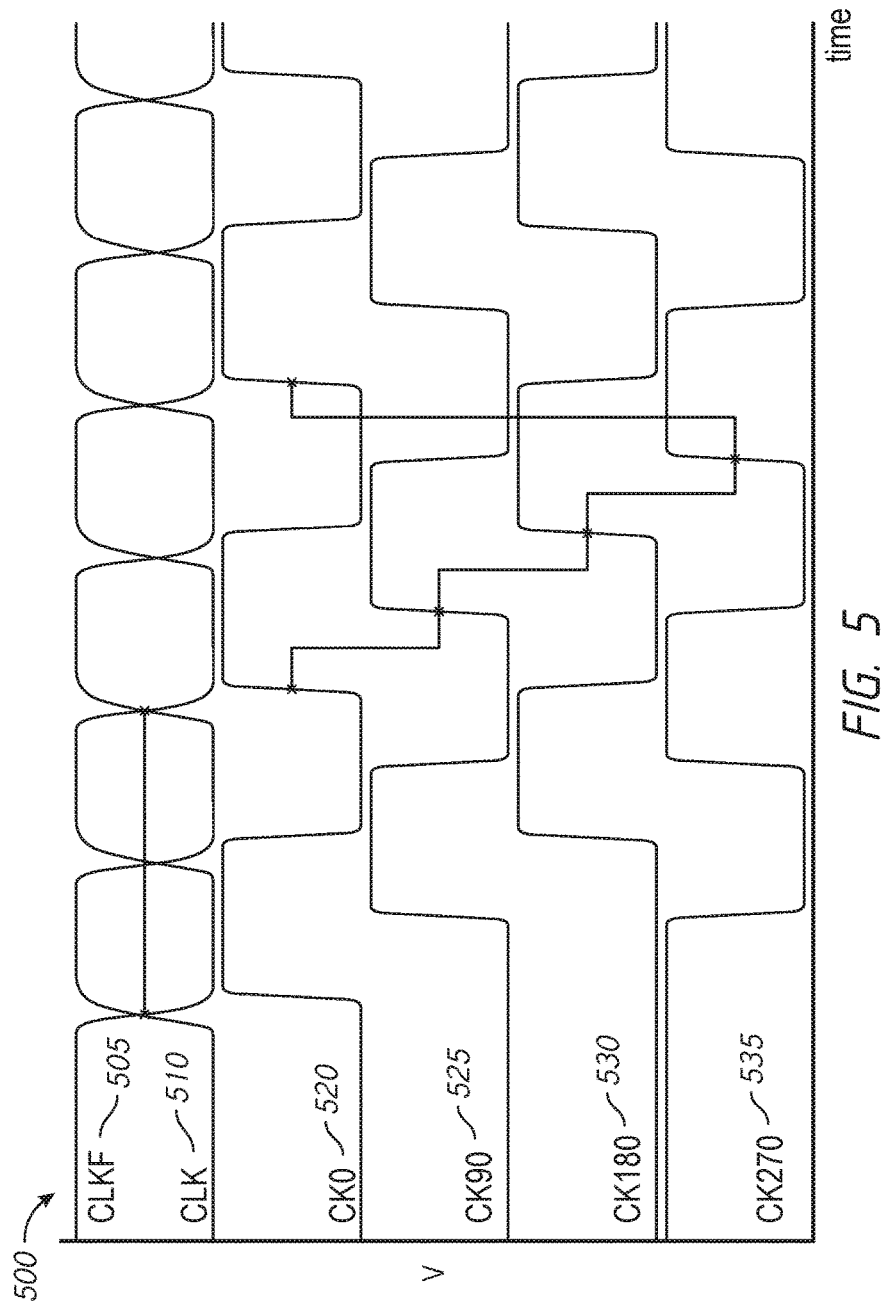
FIG. 5 is a timing diagram a quadra-phase generator with a clock signal having a period of 1000 picosecond, in accordance with various embodiments.

FIG. 5 illustrates a timing diagram 500 of a quadra-phase generator with an input clock signal, CLK, having a period of 1000 ps. In this example, $\Delta t$ may have been selected such that a period of 1000 ps is at an upper limit of the operating band for the quadra-phase generator for the given $\Delta t$. The timing diagram 500 may include waveforms for an input clock signal CLK 510, complementary input clock signal CLKF 505, 0-degree phase output clock signal (CK0) 520, 90-degree phase output clock signal (CK90) 525, 180-degree phase output clock signal (CK180) 530, and 270-degree phase output clock signal (CK270) 535. As depicted, the quadra-phase generator may be configured to have a quick initialization, generally within 1-2 clock cycles. In the embodiment depicted, for example, the phase difference between CLK 510 and CK0 520 can be much less than even one clock cycle—in this case offset by only by $\Delta t/2 + t_p$, as described above with respect to FIG. 4. Accordingly, various embodiments of the quadra-phase generator allow for a quick, or "instant-on," initialization relative to conventional techniques.

Moreover, phase error for this particular embodiment is kept within +/−8.1 ps, where the ideal phase interval is 250 ps. For example, as illustrated, the phase difference between the rising edge of CK0 520 and the rising edge of CK90 525 is 241.9 ps, thus exhibiting a phase error of only 8.1 ps. The phase difference between the rising edge of CK90 525 and the rising edge of CK180 530 is 257.6 ps, with a phase error of 7.6 ps. The phase difference between the rising edge of CK180 530 and the rising edge of CK270 535 is 242.4 ps, with a phase error of 7.6 ps. The phase difference between the rising edge of CK270 535 and the next rising edge of CK0 520 is 258.1 ps with 8.1 ps of phase error between the two signals. Accordingly, high accuracy is maintained even at the extremes of the operating band.

In other embodiments, this solution may be scalable to not only operate at lower input clock periods (higher input clock frequencies), but to improve in accuracy and performance when $\Delta t$ is selected appropriately. Thus, as fabrication processes continue to improve with increased input clock frequencies, such as in current generation DDR4 and LPDDR4, and next generation DDR5 and LPDDR5 applications, the operating band of the quadra-phase generator may also be adjusted to scale with increased (or decreased as the case may be) input clock frequencies.

Figure 6:
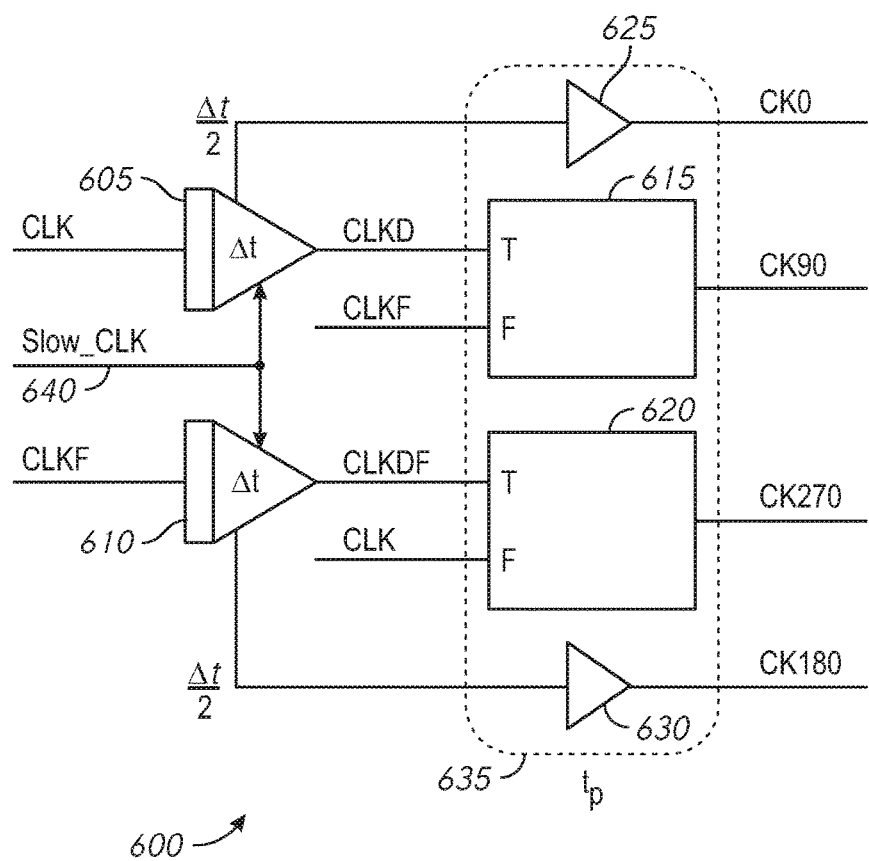
FIG. 6 is a schematic block diagram of an adjustable quadra-phase generator, in accordance with various embodiments.

FIG. 6 illustrates a schematic block diagram of an adjustable quadra-phase generator 600. The adjustable quadra-phase generator 600, like the quadra-phase generator 100 of FIG. 1, includes inputs for an input clock signal (CLK), and a complementary input clock signal (CLKF). As described previously, in some embodiments, the CLKF signal may have an inverse relationship to the CLK signal. The adjustable quadra-phase generator 600 may include a first adjustable delay circuit 605, a second adjustable delay circuit 610, an output block 635 having a first phase mixer 615, a second phase mixer 620, first buffer 625, and second buffer 630. The adjustable quadra-phase generator 600 may include outputs for a 0-degree phase output clock signal CK0, 90-degree phase output clock signal CK90, 180-degree phase output clock signal CK180, and a 270-degree phase output clock signal CK270. Because adjustable quadra-phase generator 600 shares similar hardware and operates similarly to quadra-phase generator 100 as described with respect to FIG. 1, repetitive descriptions of the common elements are omitted.

However, in contrast with quadra-phase generator 100 of FIG. 1, the adjustable quadra-phase generator 600 includes adjustable delay circuits 605, 610 configured to receive control signal Slow_CLK 640. The control signal Slow_CLK 640 may be configured to adjust the delay $\Delta t$ of the adjustable delay circuits 605, 610. In some embodiments, the adjustable delay circuits 605, 610 may be adjustable delay circuits configured to have a continuously adjustable $\Delta t$ according to Slow_CLK. 640, which may be indicative of the input clock signal frequency. In further embodiments, the adjustable delay circuits 605, 610 may alternatively be configured to select between one or more discrete $\Delta t$. For example, in various embodiments, multiple frequency ranges may be defined based on a desired total operating frequency range. In one embodiment, a frequency range corresponding to a period between 400 ps to 3 ns may be desired. The frequency range may be divided into further sub-ranges of periods: 400 ps to 1 ns, 1 ns to 2 ns, and 2 ns to 3 ns. A $\Delta t$ may be assigned for each of the sub-ranges. Accordingly, $\Delta t$ may be selected such that it is larger than ¼ of the period of the lower end of the range, but less than the full period of the lower end. In this manner, by providing one or more selectable $\Delta t$, or by providing an adjustable $\Delta t$, the operating band of the adjustable quadra-phase generator may be increased.

Figure 7B:
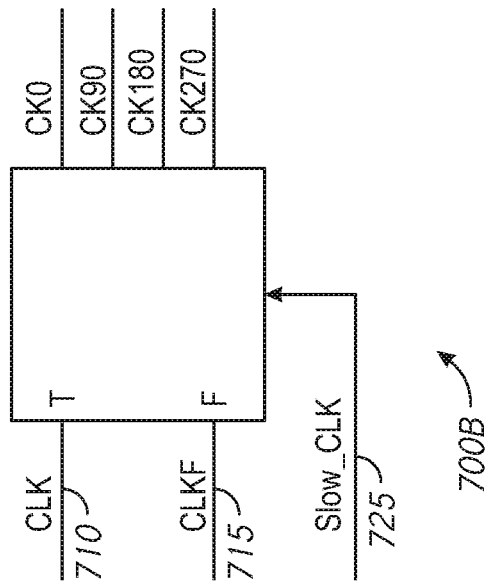
FIG. 7B is a schematic diagram of a two input adjustable quadra-phase generator, in accordance with various embodiments.
Figure 7A:
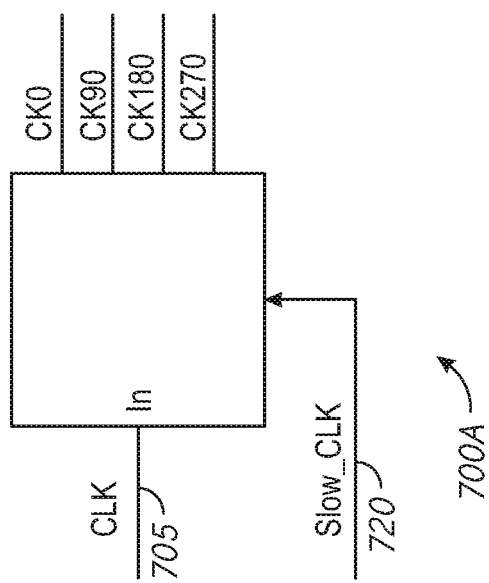
FIG. 7A is a schematic diagram of a one input adjustable quadra-phase generator, in accordance with various embodiments.

FIGS. 7A & 7B illustrate high-level schematic diagrams of a one input 700A and a two input 700B adjustable quadra-phase generator, in accordance with various embodiments. Many of the common features and elements described previously, with respect to FIGS. 2A & 2B, are omitted in the interest of brevity. In contrast with the quadra-phase generators 200A, 200B of FIG. 2, however, the adjustable quadra-phase generators 700A, 700B may additionally include inputs for control signal Slow_CLK 720, 725. Thus, Slow_CLK 720, 725 may allow the first and second delay circuits in each of the adjustable quadra-phase generators 700A, 700B, respectively, to adjust $\Delta t$ according to the period of input CLK. In this manner, $\Delta t$ may be adjusted in each of the adjustable quadra-phase generators 700A, 700B to allow operation over a larger range of input clock signal frequencies (or periods).

Figure 8:
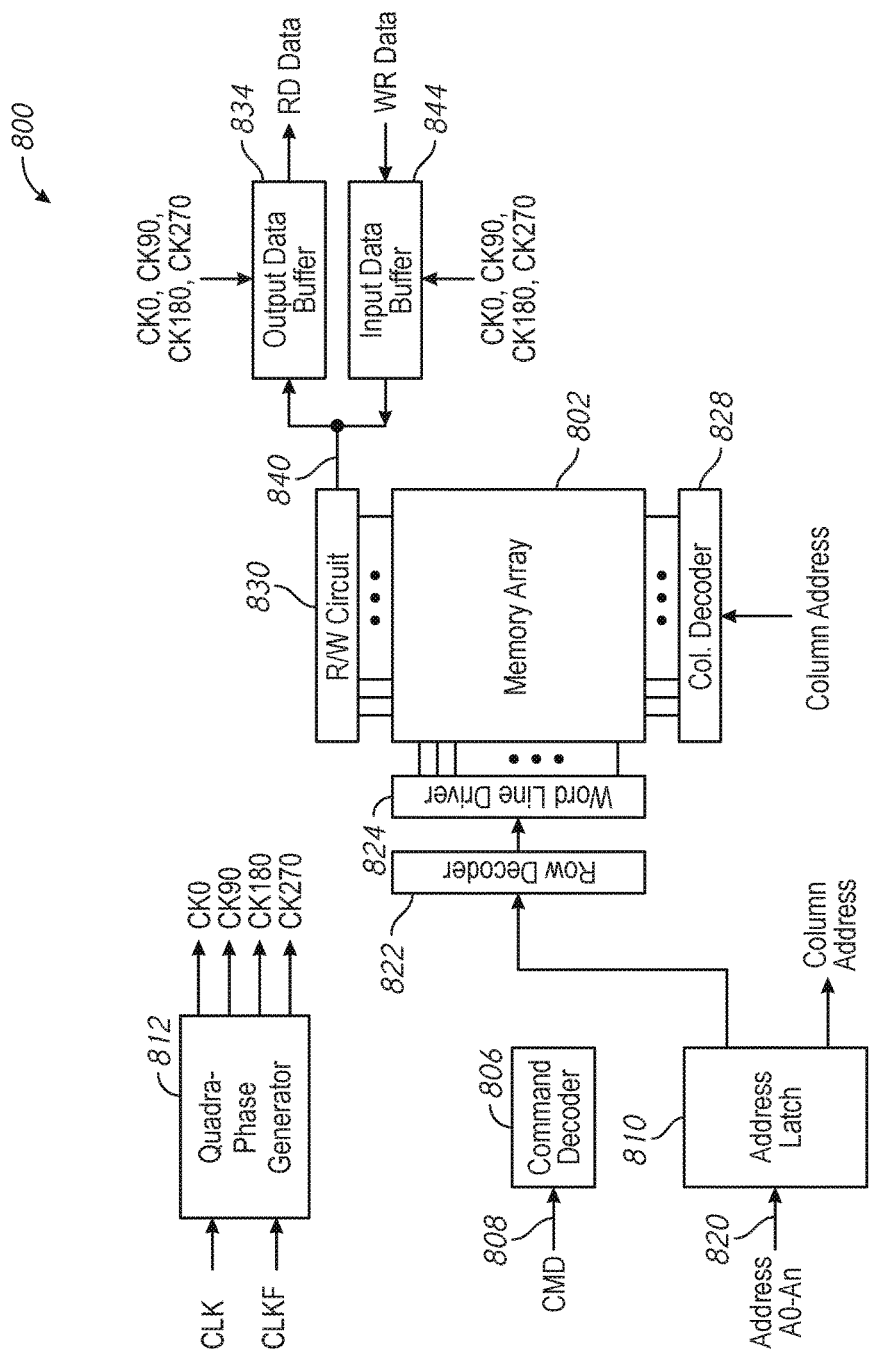
FIG. 8 is a block diagram of a memory system, in accordance with various embodiments.

FIG. 8 is a block diagram of a portion of a memory system 800, in accordance with various embodiments. The system 800 includes an array 802 of memory cells, which may be, for example, volatile memory cells (e.g., dynamic random-access memory (DRAM) memory cells, low-power DRAM memory (LPDRAM), static random-access memory (SRAM) memory cells), non-volatile memory cells (e.g., flash memory cells), or other types of memory cells. The memory 800 includes a command decoder 806 that may receive memory commands through a command bus 808 and provide (e.g., generate) corresponding control signals within the memory 800 to carry out various memory operations. For example, the command decoder 806 may respond to memory commands provided to the command bus 808 to perform various operations on the memory array 802. In particular, the command decoder 806 may be used to provide internal control signals to read data from and write data to the memory array 802. Row and column address signals may be provided to an address latch 810 in the memory 800 through an address bus 820. The address latch 810 may then provide a separate column address and a separate row address.

The address latch 810 may provide row and column addresses to a row address decoder 822 and a column address decoder 828, respectively. The column address decoder 828 may select bit lines extending through the array 802 corresponding to respective column addresses. The row address decoder 822 may be connected to a word line driver 824 that activates respective rows of memory cells in the array 802 corresponding to the received row addresses. The selected data line (e.g., a bit line or bit lines) corresponding to a received column address may be coupled to a read/write circuitry 830 to provide read data to an output data buffer 834 via an input-output data path 840. Write data may be provided to the memory array 802 through an input data buffer 844 and the memory array read/write circuitry 830.

Quadra-phase generator 812 may be a quadra-phase generator as described in any of the embodiments above. Quadra-phase generator 812 may provide multi-phase output clock signals CK0, CK90, CK180, CK270 to other circuits of memory 800, such as R/W circuit 830, output data buffer 834, input data buffer 844, command decoder 806, address latch 810, row address decoder 822, word line driver 824, and column address decoder 828, or any other circuit or component requiring a particular multi-phase output clock signal.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
a first delay circuit configured to receive a first input clock signal and generate a first delayed clock signal, the first delay circuit configured to adjust a delay of the first delayed clock signal based, at least in part, on a period of the first input clock signal; and
a first phase mixer coupled to the first delay circuit and configured to generate a first output clock signal responsive, at least in part, to mixing of the first delayed clock signal and a second input clock signal.

2. The apparatus of claim 1, wherein the first phase mixer comprises a first input and a second input.

3. The apparatus of claim 2, wherein the first delayed clock signal is received at the first input of the first phase mixer and the second input clock signal is received at the second input of the first phase mixer.

4. The apparatus of claim 1, further comprising a second delay circuit configured to receive the second input clock signal and generate a second delayed clock signal.

5. The apparatus of claim 4, further comprising a second phase mixer coupled to the second delay circuit and configured to receive the second delayed clock signal at a third input and the first input clock signal at a fourth input.

6. The apparatus of claim 5, wherein the second phase mixer is configured to generate a second output clock signal responsive, at least in part, to mixing the second delayed clock signal and the first input clock signal.

7. The apparatus of claim 6, wherein the first delay circuit is configured to generate a third delayed clock signal, wherein the third delayed clock signal has less delay than the first delayed clock signal.

8. The apparatus of claim 7, wherein the second delay circuit is further configured to generate a fourth delayed clock signal, wherein the fourth delayed clock signal has less delay than the second delayed clock signal.

9. The apparatus of claim 8, further comprising:
a first buffer configured to generate a third output clock signal based on the third delayed clock signal; and
a second buffer configured to generate a fourth output clock signal based on the fourth delayed clock signal.

10. The apparatus of claim 9, wherein each of the first and second delay buffers is configured to have a propagation delay that matches a propagation delay of each of the first phase mixer and the second phase mixer.

11. A method comprising:
generating a first delayed clock signal in response to receiving a first input clock signal;
adjusting a delay of the first delayed clock signal based, at least in part, on a period of the first input clock signal; and
generating a first output clock signal responsive, at least in part, to mixing the first delayed clock signal and a second input clock signal.

12. The method of claim 11, further comprising receiving the first delayed clock signal at a first input of a first phase mixer.

13. The method of claim 12, further comprising receiving the second input clock signal at a second input of the first phase mixer.

14. The method of claim 13, further comprising generating a second delayed clock signal, via a second delay circuit, wherein the second delayed clock signal is received at a second phase mixer.

15. The method of claim 14, further comprising generating a second output clock signal responsive; at least in part, to mixing the second delayed clock signal and the first input clock signal.

16. The method of claim 15, further comprising generating a third delayed clock signal, via a first delay circuit, wherein the third delayed clock signal has less delay than the first delayed clock signal.

17. The method of claim 16, further comprising generating a fourth delayed clock signal, via the second delay circuit, wherein the fourth delayed clock signal has less delay than the second delayed clock signal.

18. The method of claim 17, further comprising:
generating, via a first buffer, a third output clock signal based on the third delayed clock signal; and
generating, via a second buffer, a fourth output clock signal based on the fourth delayed clock signal.

19. The method of claim 18, further comprising exhibiting a propagation delay at both the first and second buffers that matches a propagation delay of the first and second phase mixers.

20. The method of claim 18, wherein generating the first output clock signal includes generating a 90-degree phase output clock signal, wherein generating the second output clock signal includes generating a 270-degree phase output clock signal, wherein generating the third output clock signal includes generating a 0-degree phase output clock signal, and wherein generating the fourth output clock signal includes generating a 180-degree phase output clock signal.

* * * * *